United States Patent [19]

Munday et al.

[11] 4,025,865
[45] May 24, 1977

[54] FREQUENCY-SIGNALLING CIRCUIT FOR A TELEPHONE

[75] Inventors: John Charles Munday, Cupar; Andrew McDonald, Glenrothes, both of Scotland

[73] Assignee: General Instrument Corporation, Clifton, N.J.

[22] Filed: Jan. 8, 1976

[21] Appl. No.: 647,513

[52] U.S. Cl. .................................. 328/14; 328/18; 328/48; 331/78; 340/347 DA

[51] Int. Cl.² ...................... H03K 3/84; H03K 3/02

[58] Field of Search .................. 328/14, 15, 16, 18, 328/48; 340/347 DA; 331/78

[56] References Cited

UNITED STATES PATENTS

| | | | |
|---|---|---|---|
| 3,787,836 | 1/1974 | Hagelbarger | 340/347 DA |
| 3,820,028 | 6/1974 | Thomas | 328/14 |
| 3,829,783 | 8/1974 | Groenendaal et al. | 328/14 |
| 3,832,639 | 8/1974 | Janssen | 328/14 |
| 3,882,403 | 5/1975 | Gerken | 328/14 |
| 3,952,189 | 4/1976 | Fabricius | 328/14 X |

*Primary Examiner*—John S. Heyman
*Attorney, Agent, or Firm*—James & Franklin

[57] ABSTRACT

A frequency signaling circuit includes a plurality of channels, each channel having division means for frequency division of a clock signal, the division ratio being selected in accordance with data defining the required frequency. Stochastic conversion means are provided for converting the output of the frequency division means into pulse trains with the repetition rate of the required frequency. The stochastic conversion means includes a noise generating circuit, a value generating circuit for generating signals representing a predetermined sequence of values at a rate determined by the output of the division means and a comparison circuit for comparing the values produced by the value generating circuit with the values represented by the outputs of the noise generating circuit and for producing a pulse whenever a predetermined relation exists between the values.

12 Claims, 15 Drawing Figures

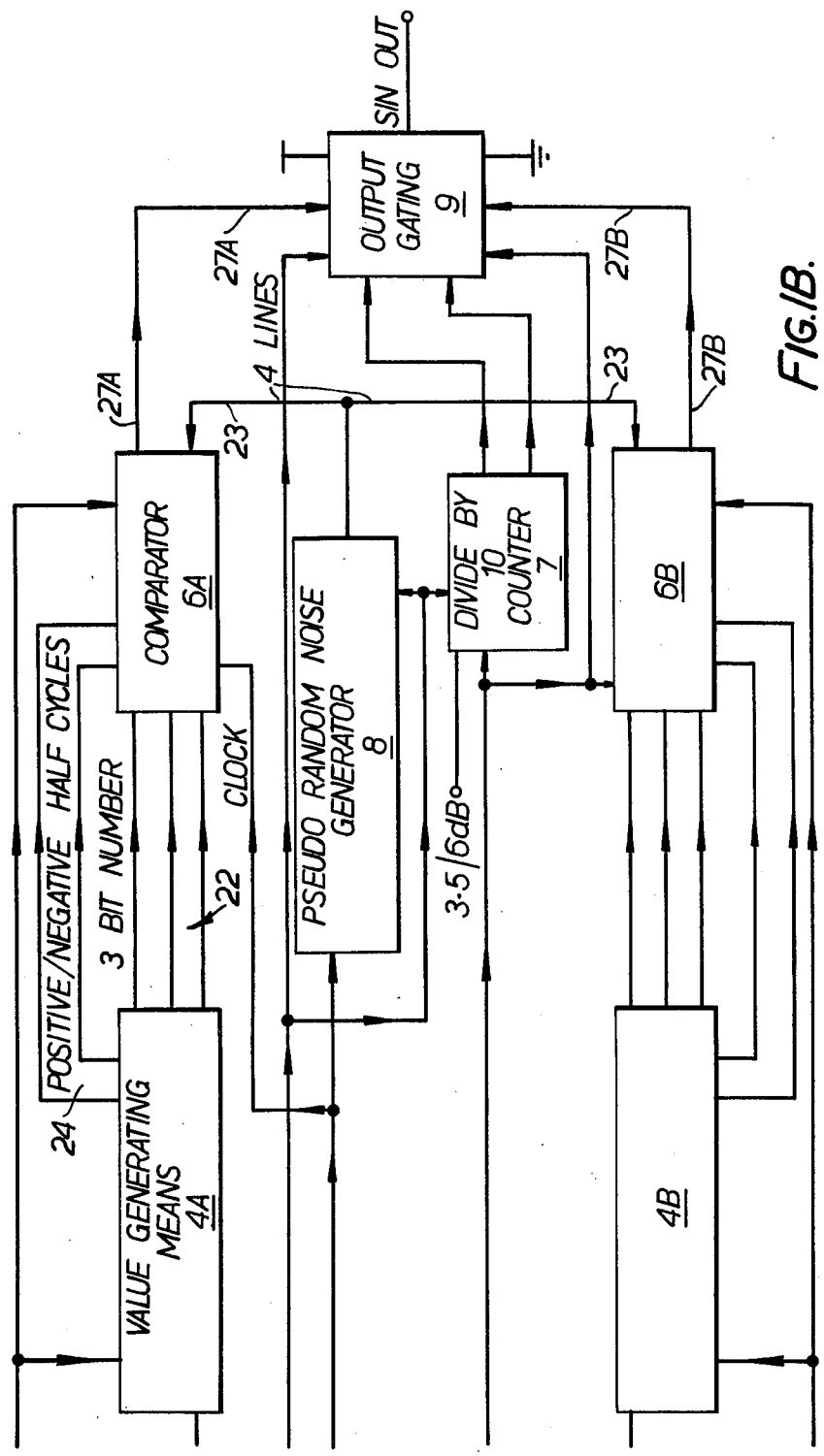
FIG./B.

FREQUENCY-SIGNALLING CIRCUIT FOR A TELEPHONE

BACKGROUND OF THE INVENTION

The present invention relates to frequency-signal circuits and is particularly applicable to the field of telephone frequency-signalling circuits.

DESCRIPTION OF THE PRIOR ART

U.S. Pat Nos. 3,820,028, 3,833,639 and 3,787,836 disclose circuits for use in generating digitally synthesized sinusoidal waveforms. In each case a waveform is synthesized or represented by a digital signal and analogue current source or resistor networks are employed for analogue conversion. These analogue techniques used in the prior art are not entirely predictable in that their performances can vary with environmental factors such as temperature and humidity.

An object of the present invention is to provide means for synthesizing and mixing waveforms by digital techniques such that simple low-pass filters or integrators can be used for the conversion to analogue form. Such filters or integrators are considerably more reliable under varying environmental conditions. The present invention is based on the realization that completely different digital synthesizing techniques using stochastic conversion enable synthesis and mixing to occur purely digitally to produce a pulse train in a form suitable for filtering or integrating. Such conversion is known for use, for example, in industrial process control and is described in U.K. Pat. No. 1,314,449.

SUMMARY OF THE INVENTION

According to the invention, there is provided a circuit suitable for use in an $m$ of $n$ frequency-signalling system, the circuit comprising: first input means for a clock signal; second input means for receiving data defining $m$ required frequencies; $m$ channels for synthesizing respective ones of the $m$ frequencies out of $n$ possible frequencies, each channel comprising division means for frequency division of the clock signal, the division ratio being selected in response to the said data; stochastic conversion means for converting the outputs of the frequency division means into pulse trains the repetition rates of which vary, respectively, at the $m$ frequencies; and means for mixing the pulse trains by interleaving the trains in time.

Each pulse train provides a voltage-time area which varies with the frequency concerned. Accordingly, a relatively simple filter or integrator can produce the required analogue waveform directly from the output of the mixing means. In integrated circuit form, therefore, the invention requires only one output pin for the waveform, connected to a relatively simple analogue conversion circuit.

Preferably, the mixing means are adjustable to vary the proportions of the frequencies in the output; in this way a desired degree of higher frequency pre-emphasis can be achieved, as is desirable in multi-frequency telephone dialling.

Preferably the stochastic conversion means comprises: noise generator means; value generating means for generating signals representing a predetermined sequence of values at a rate determined by the output of the division means; and comparison means for comparing the values produced by the value generating means with the values represented by the outputs of the noise generating means and producing a pulse whenever a predetermined relation exists between said values.

For optimum frequency accuracy and low distortion, a high clock frequency is desirable since this allows large division ratios (thus giving high accuracy) and a large number of wave-form samples, (thus giving low distortion). However, a high frequency increases power dissipation, which is undesirable, and many make it necessary to use a quartz crystal for the source of clock frequency. By using non-integer frequency division, the clock frequency can be halved, whilst keeping substantially the same levels of accuracy and distortion. In the preferred embodiment, this also enables a ceramic crystal or filter to be used to define the clock frequency, this being less expensive than a quartz crystal.

The frequency division may be achieved by means alternately dividing by two integral amounts, the mean of these amounts equalling the non-integral divisor required. For example, division by 24.5 can be achieved by alternate division by 24 and 25. This has proved to increase the speed of operation over a method of non-integer division such as disclosed in Journal of Audio Engineering Society, June 1972, Vol. 20, No. 5, Pages 376–382.

BRIEF DESCRIPTION OF THE DRAWINGS

For a better understanding of the invention, and to show how the same may readily be carried into effect, reference will now be made, by way of example, to the accompanying drawings in which.

DESCRIPTION OF A PREFERRED EMBODIMENT

Figure 1A:
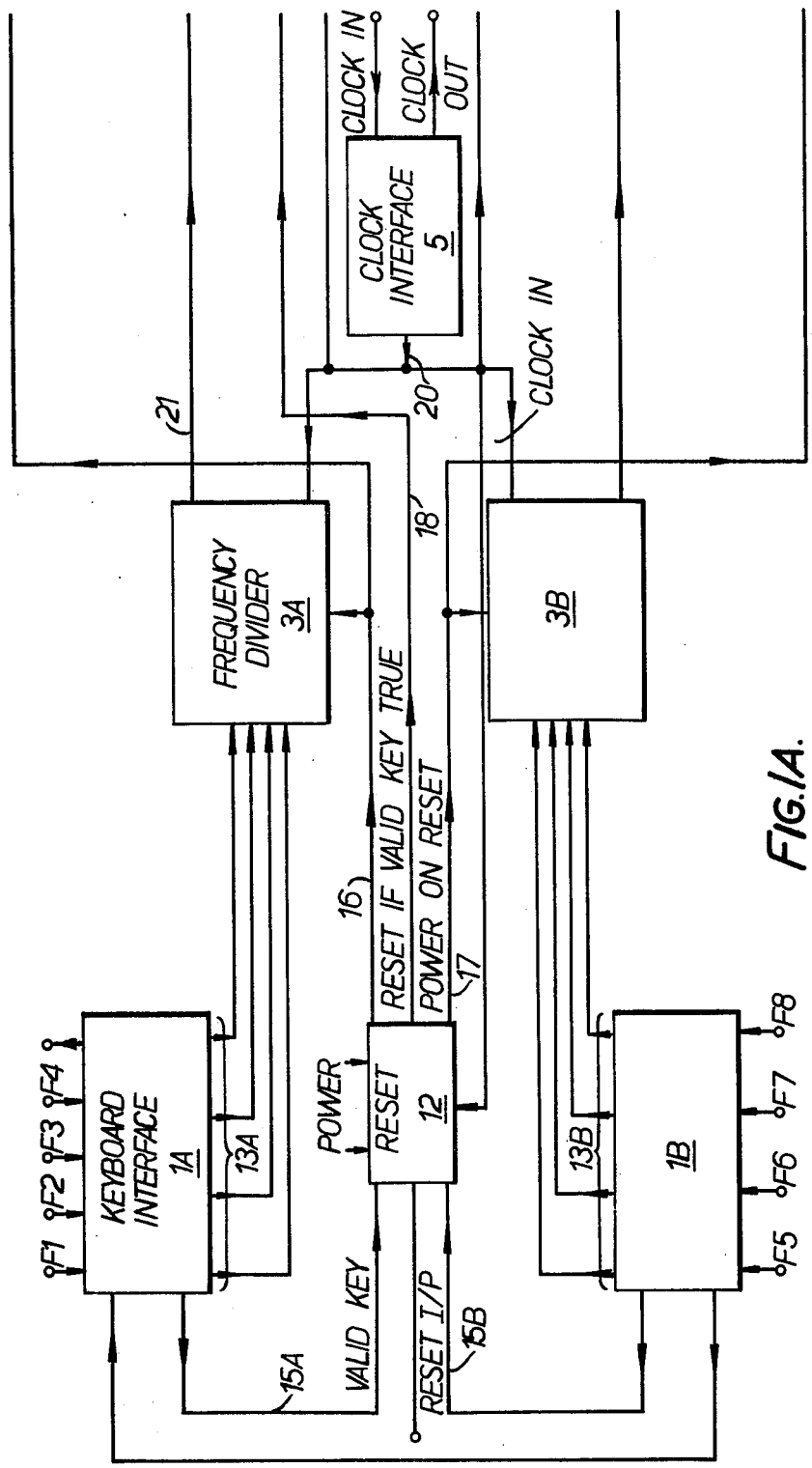
FIG. 1 is a block diagram of a waveform synthesising circuit.
Figure 14:
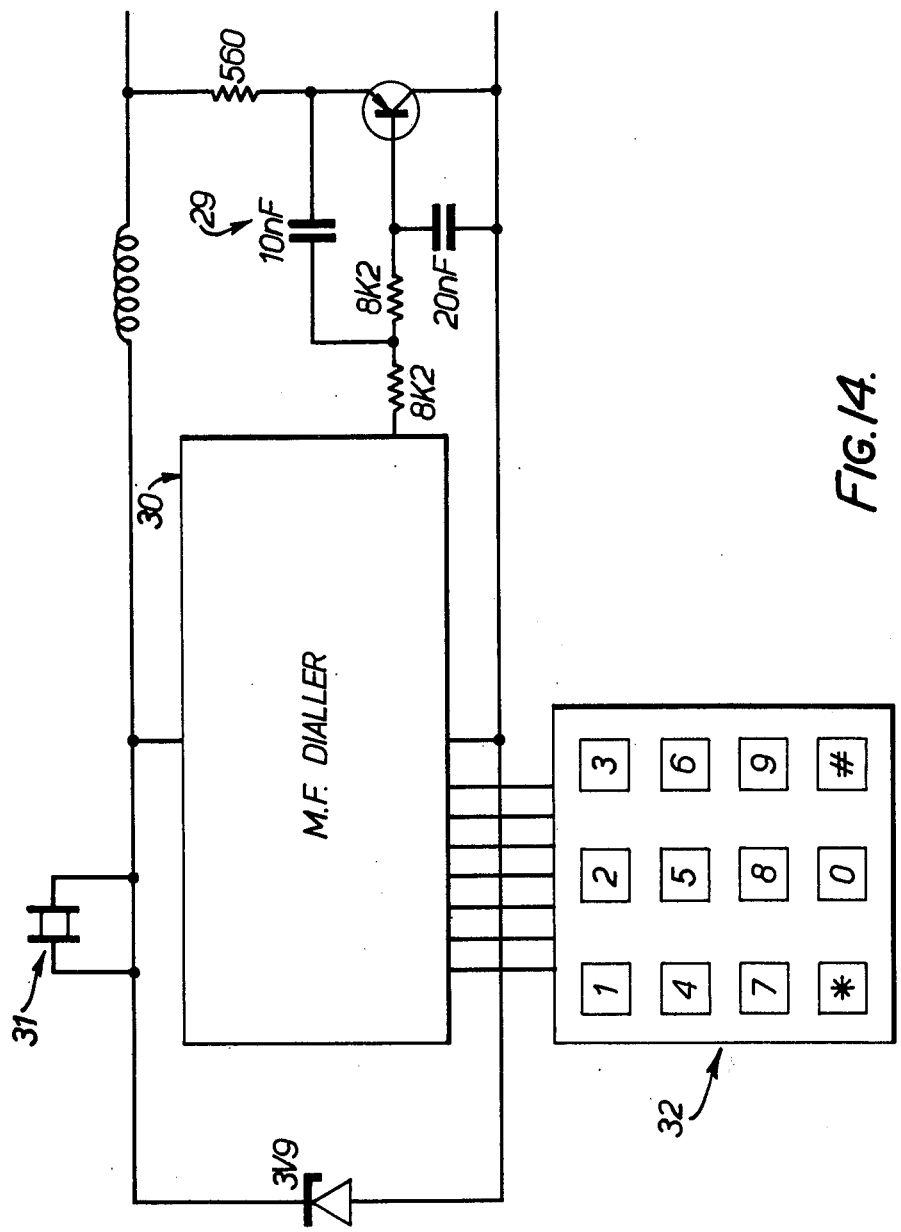
FIG. 14 is a diagram showing how the frequency synthesising circuit may be connected to other components.

In many countries, the normal rotary dialling telephone, having an output consisting of intermittent D.C. pulses, is presently being replaced by a two-tone generating system called an M.F. (Multi-Frequency) dialling or signalling system which is conventionally operated by way of a keyboard. Such a system allows almost instantaneous call connection. Typical requirements for the two tones are that they be within ± 1.8% of specified frequencies, that they have less than −20dB total distortion and that they are present within 10ms of key depression. FIG. 1 is a block diagram of a waveform synthesising circuit which can be used in such a multi-frequency signalling system to generate signals defining the frequencies concerned. This waveform synthesising circuit can be in the form of a signal integrated circuit of IGFET devices. This circuit is to be used in conjunction with a keyboard coupled to at least some of input lines F1 to F8 of the circuit, as is shown in FIG. 14. Although a 12-key keyboard is sufficient for a domestic telephone, in some applications a 16-key keyboard is required. The embodiment illustrated in FIG. 1 can accommodate inputs from up to 16 keys.

Each key will activate, on depression, one line of the lines F1 to F4 and one line of the lines F5 to F8, each pair of lines thus activated being unique for the key pressed. The synthesising circuit comprises two frequency-generating branches A and B, composed of elements 1A, 3A, 4A, 6A and 1B, 3B, 4B, 6B respectively, together with other circuit blocks 5, 7, 8, 9 and 12. Branch A operates to produce one of four frequencies, dependent upon which line F1 to F4 is activated and branch B operates to produce one of four further frequencies dependent upon which line of F5 to F8 is activated. Within the required tolerance, branch A will produce 697Hz, 770Hz, 852Hz and 941Hz and branch B will produce 1209Hz, 1336Hz, 1477Hz and 1633Hz.

Depression of a key also causes power to be supplied to the synthesising circuit, and causes a reset arrangement 12 to operate.

Considering branch A very briefly, depression of a key activates a keyboard interface 1A which controls the divisor of a frequency divider 3A. The divider operates to clock a value generating means 4A whose output is compared, in a comparator 6A, with the output of a pseudo-random noise generator 8 for stochastic waveform generation. The stochastic pulse train output of the comparator is taken to an output gating circuit 9 where it is combined with the output of the similar comparator 6B of branch B. The relative levels of the respective outputs from the two branches are adjusted to a ratio of −3.5 dB or −6 dB by means of the output from a divide-by-ten counter 7 in dependence upon the signal on an input denoted 3.5/6 dB. Branch B functions in a similar manner to branch A and also makes use of the pseudo-random noise generator 8.

A clock input is taken via a clock interface 5 to clock the comparators 6A and 6B, the dividers 3A and 3B, the noise generator 8, the divide-by-ten counter 7 and the output gating circuit 9. The clock input is taken from a ceramic filter at a frequency of 559.7kHz.

The circuit will now be described in more detail with reference particularly to channel A and FIGS. 2 to 13.

Figure 2:
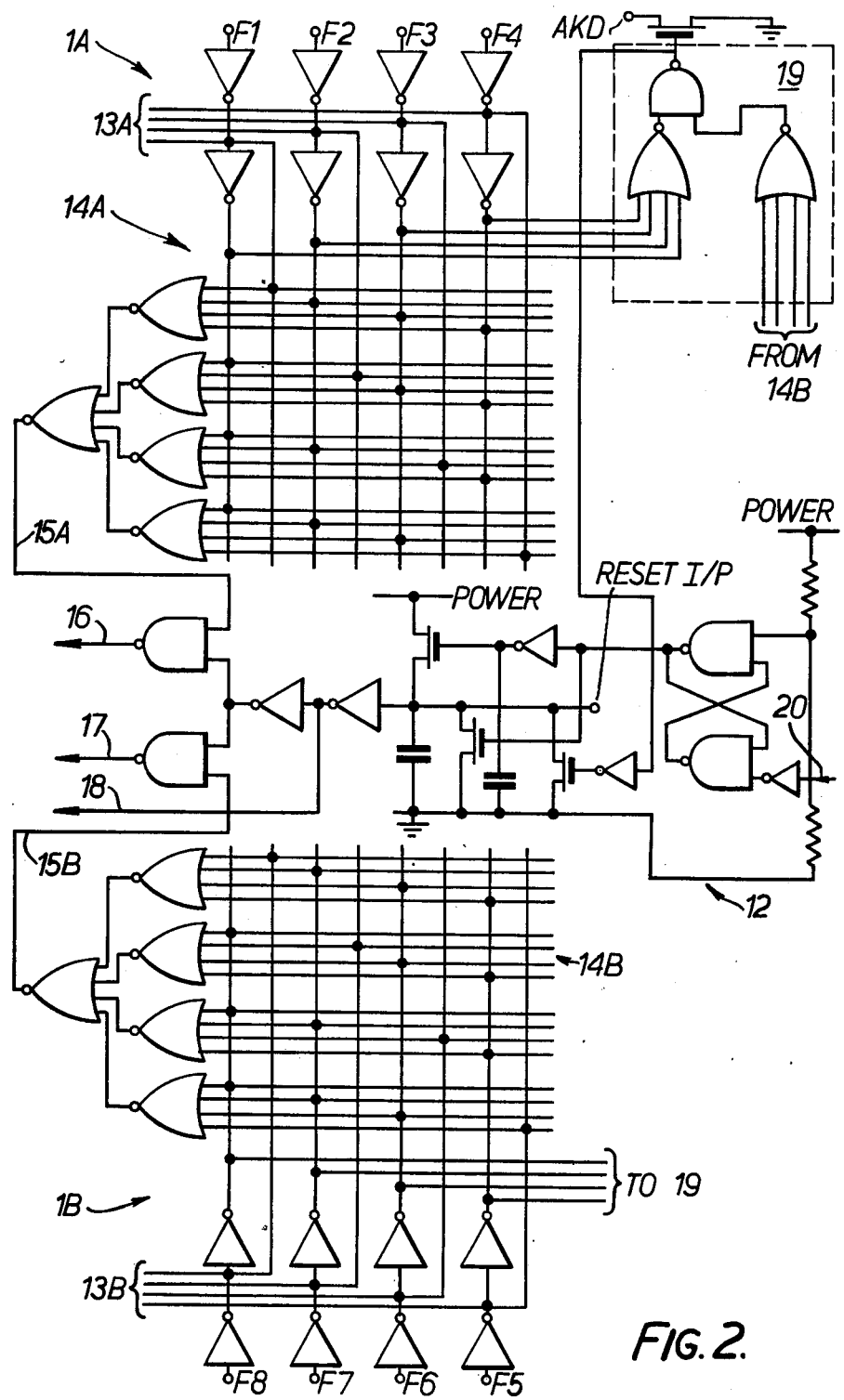
FIG. 2 is a detailed circuit diagram of block 1A of FIG. 1.

The circuits of interfaces 1A and 1B and reset arrangement 12 are shown in FIG. 2. When a key of the keyboard is depressed, one of lines F1 to F4 and one of line F5 to F8 is energised, this passing a corresponding signal on one of lines 13A and one of lines 13B to the corresponding frequency dividers 3A and 3B.

Each interface includes a decoding network 14A and 14B which produces a VALID KEY signal on lines 15A and 15B, connected to the reset arrangement 12, when the decoding networks detect that only one key has been depressed. When power is supplied to the reset arrangement 12, it produces three reset pulses, one of which occurs on line 16 to reset divider 3A, value generating means 4A and comparator 6A, a second of which occurs on line 17 to reset the corresponding items in branch B and the third of which occurs on line 18 to reset the noise generator 8, the divide-by-ten counter 7 and the output gating circuit 9. These reset pulses are transitory 'high' pulses for normal operation. The third reset pulse is always such a pulse. However, the first and second pulses are only transitory if the VALID KEY signals are produced on line 15A and 15B. If the VALID KEY signals are not produced (e.g. if two keys are depressed simultaneously) the first and second reset pulses remain high during depression of a key thus inhibiting operation of their associated items.

A logic arrangement 19 produces an output signal on an any-key down output AKD whenever a key is depressed. This output signal may be used, for example, for transmission equipment muting.

Figure 3:
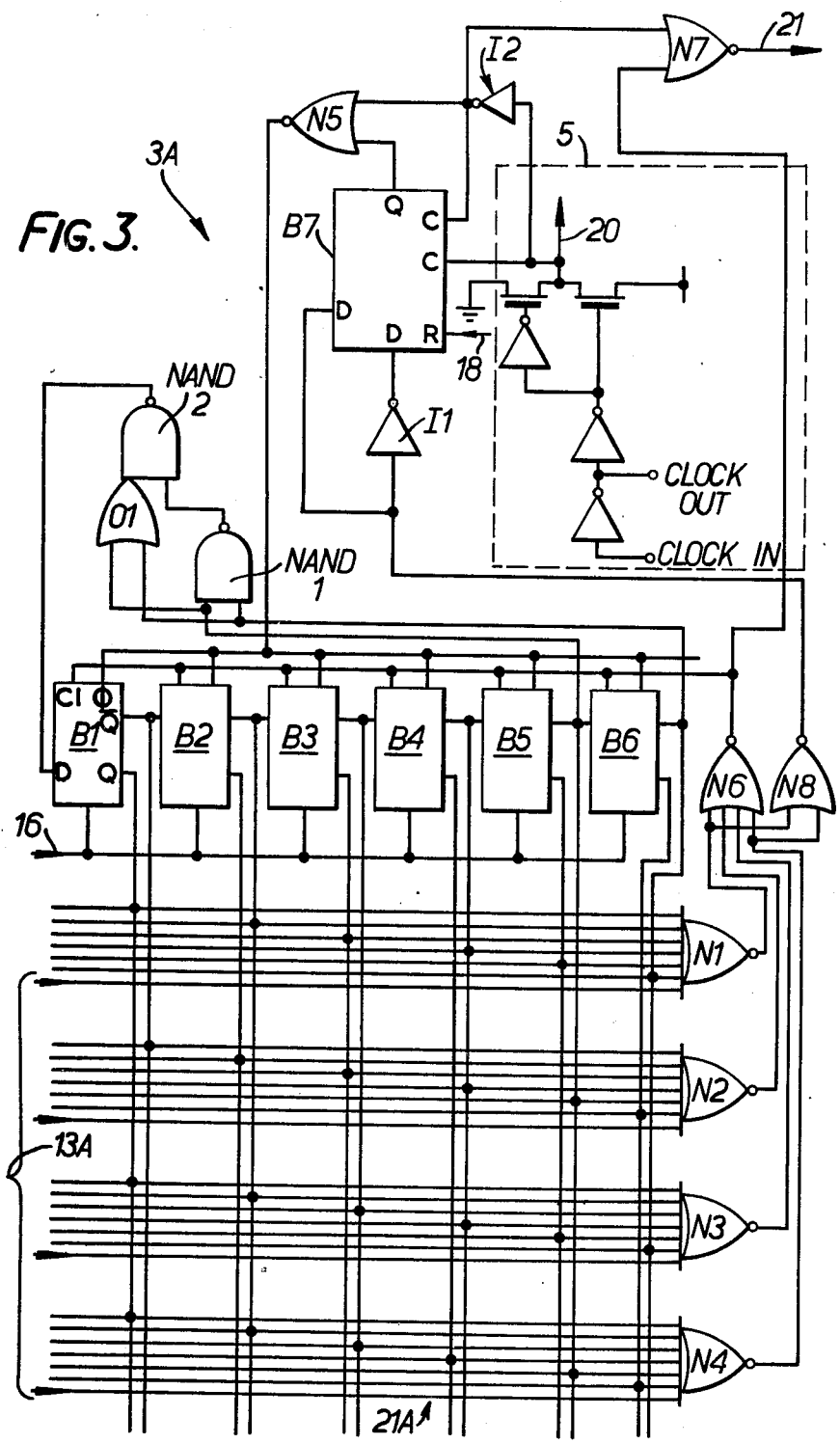
FIG. 3 is a detailed circuit diagram of block 3A of FIG. 1.
Figure 4:
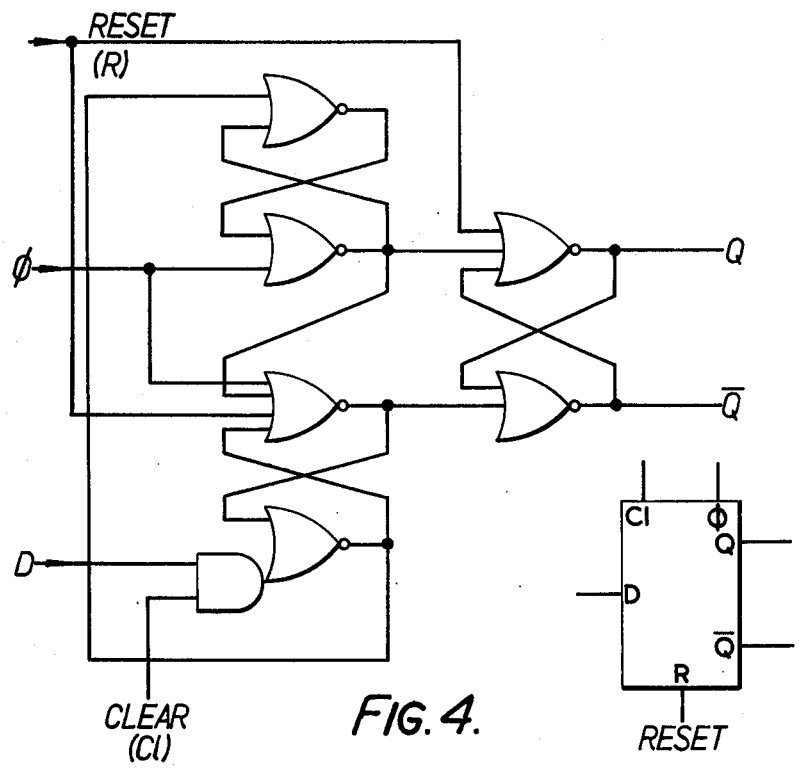
FIGS. 4 and 5 show circuit diagrams of two bistable circuits of FIG. 3.
Figure 5:
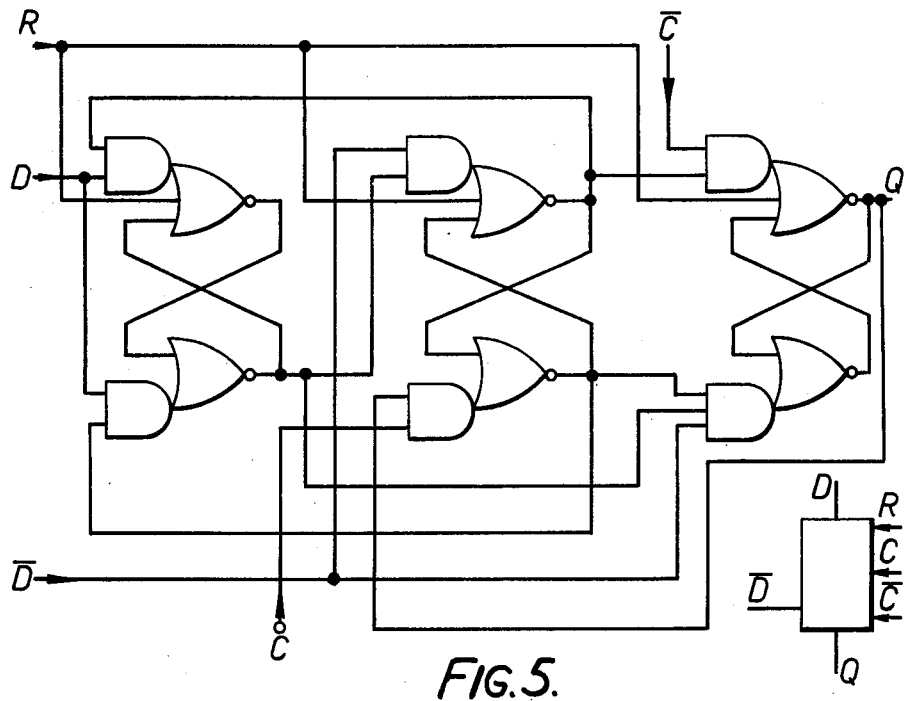
Figure 6:
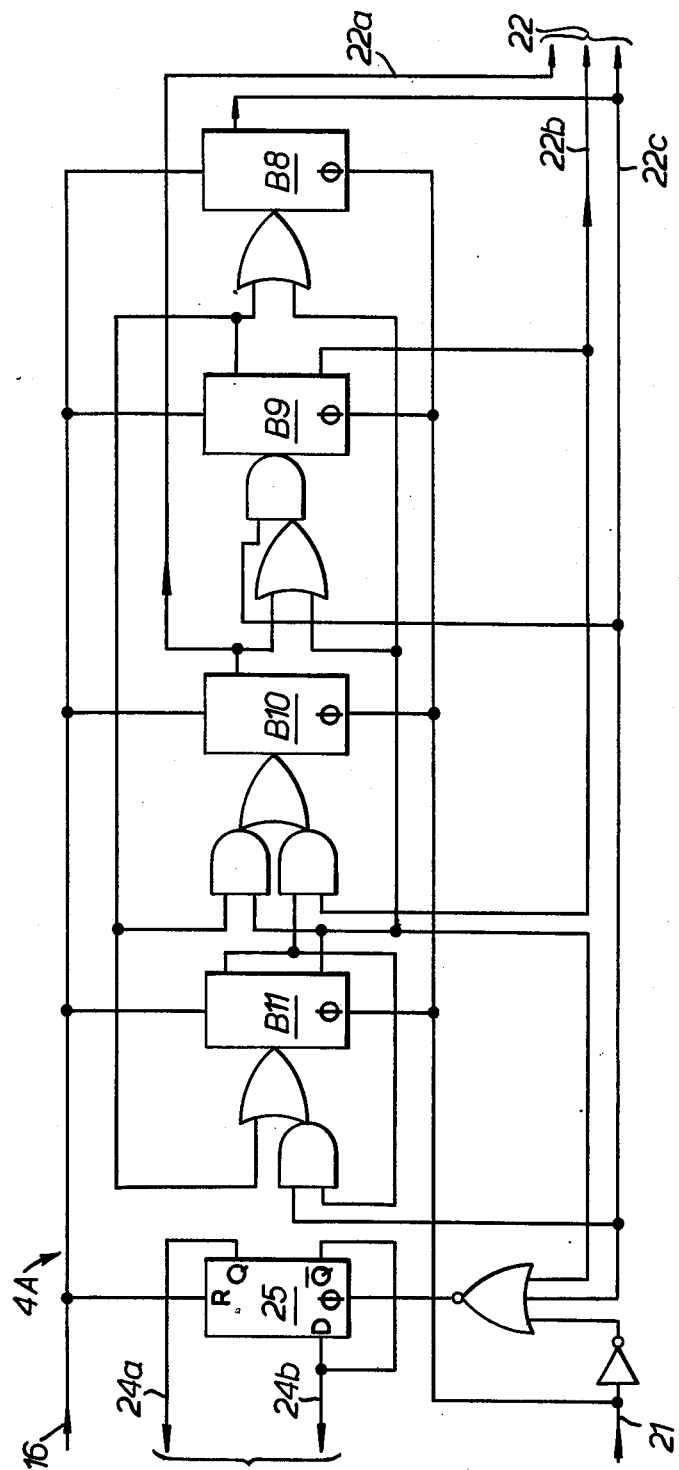
FIG. 6 is a detailed circuit diagram of block 4A of FIG. 1.

The divider 3A comprises means to enable it to divide by a number which is not an integer. With a clock frequency of 559.7kHz, the divisors in branch A should be 57.5, 52, 47, 42.5 and in branch B they should be 33, 30, 37 and 24.5. FIG. 3 is a circuit diagram of the frequency divider 3A of FIG. 1 and the clock interface 5. The four lines 13A from the interface 1A are taken to NOR gates N1 to N4 respectively. FIG. 3 also shows a synchronous counter comprising six bistable stages B1 to B6 each of which is of a type as shown in FIG. 4. The counter has feed-back elements which are NAND gates NAND1 and NAND2 and OR gate 01. NOR gate N5, inverters I1 and I2 are bistable circuit B7 form a clock processing means operable to process a clock signal produced by the clock interface 5 on a line 20 also going elsewhere in the system. Circuit B7 is of the type as shown in FIG. 5.

The counter will be clocked via its clock inputs, denoted $\phi$, to cause it to count. Four different counts of this counter corresponding to respective divisors are monitored by respective NOR gates N1 to N4 via a decoding circuit 21A. If one of the input line 13A has a true ('low') signal, the output of the associated gate will go false ('high') each time the associated count is reached. Outputs of the NOR gates N1 to N4 are connected to the inputs of NOR gate N6. A false input to N6 will produce a true output which is supplied to the clear (C1) inputs of the counter to clear the counter. That true output also provides a false output of the divider via NOR gate N7 clocked by a clock signal from inverter I2.

In this embodiment, gates N2 and N3 (not connected to gate N8) function to detect the counts for the integral divisors 52 and 47. Gates N1 and N4 detect counts of 57 and 42, nominally to set up divisors of 57 and 42. However, if either of gates N1 and N4 respond, gate N8 responds to change the mode of operation of bistable circuit B7. Whenever this circuit B7 receives a signal form gate N8, it divides the clock signal into two pulses. This alone produces a count of one more than that decoded. However, at every other response of gate N8, a clock pulse is suppressed by circuit B7, giving the consequence that the divider divides by one more than the count detected only on alternate cycles. On average, therefore the required non-integral value is achieved.

Divider 3B differs from divider 3A in that only its gate N4 is connected to gate N8, because only one non-integral division is required in this channel.

Figure 7:
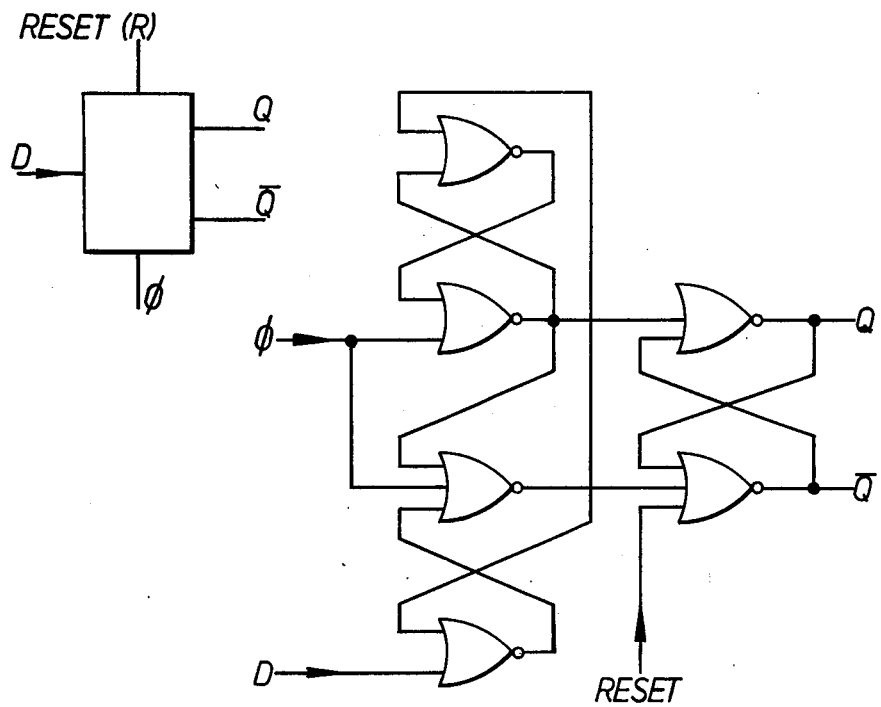
FIG. 7 is a circuit diagram of a bistable circuit of FIG. 6.
Figure 8:
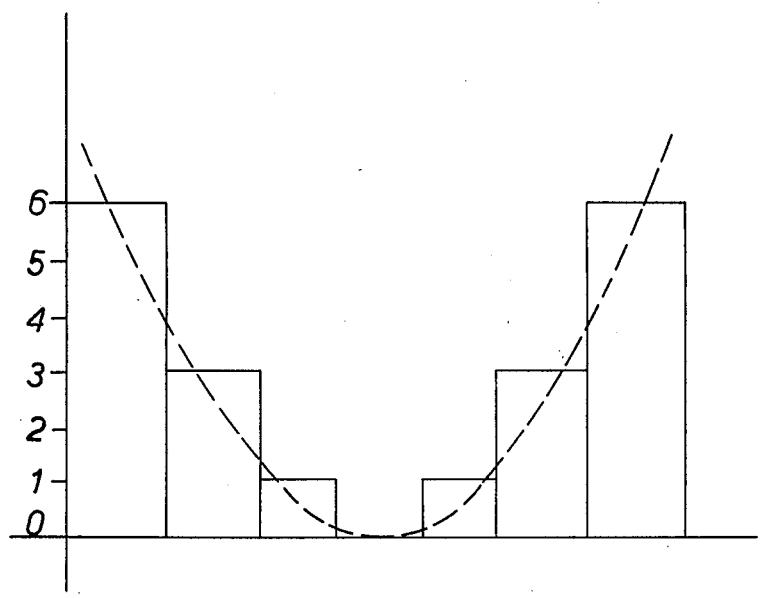
FIG. 8 is a diagram showing an analogue representation of the output of block 4A.
Figure 9:
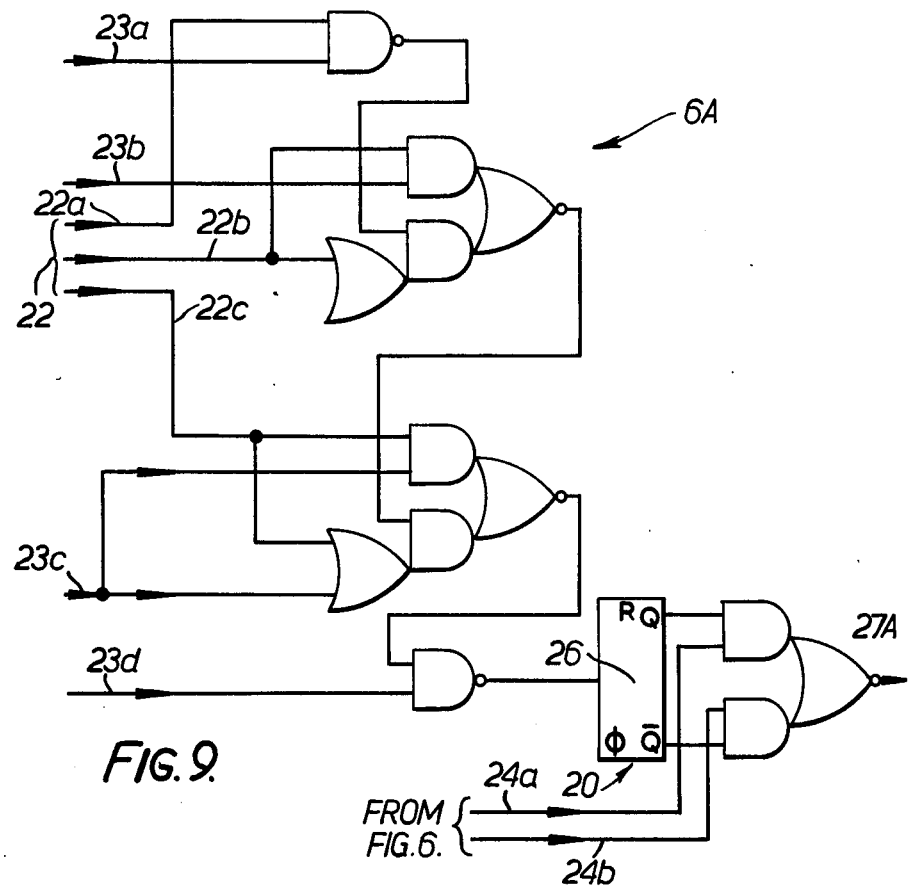
FIG. 9 is a detailed circuit diagram of the block 6A of the circuit of FIG. 1.
Figure 10:
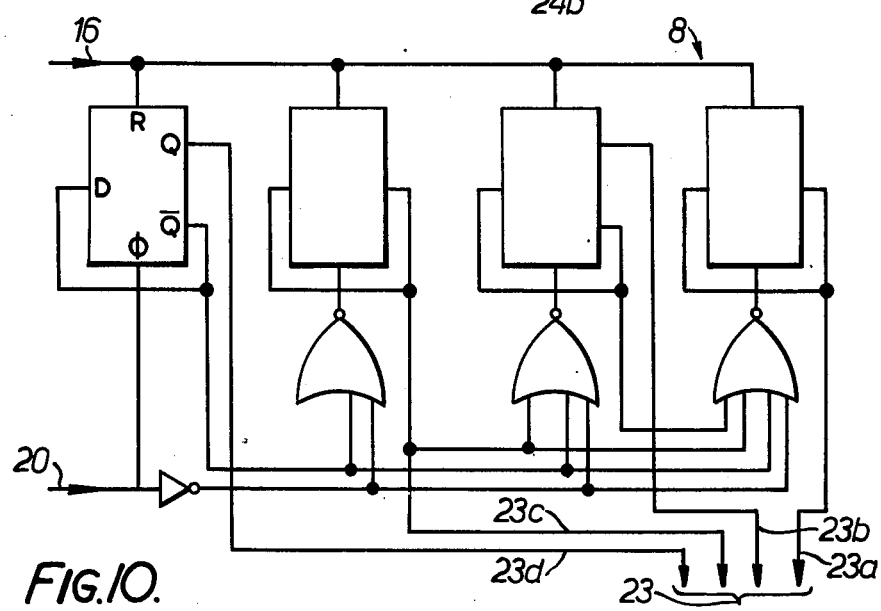
FIG. 10 is a detailed circuit diagram of block 8 of FIG. 1.
Figure 11:
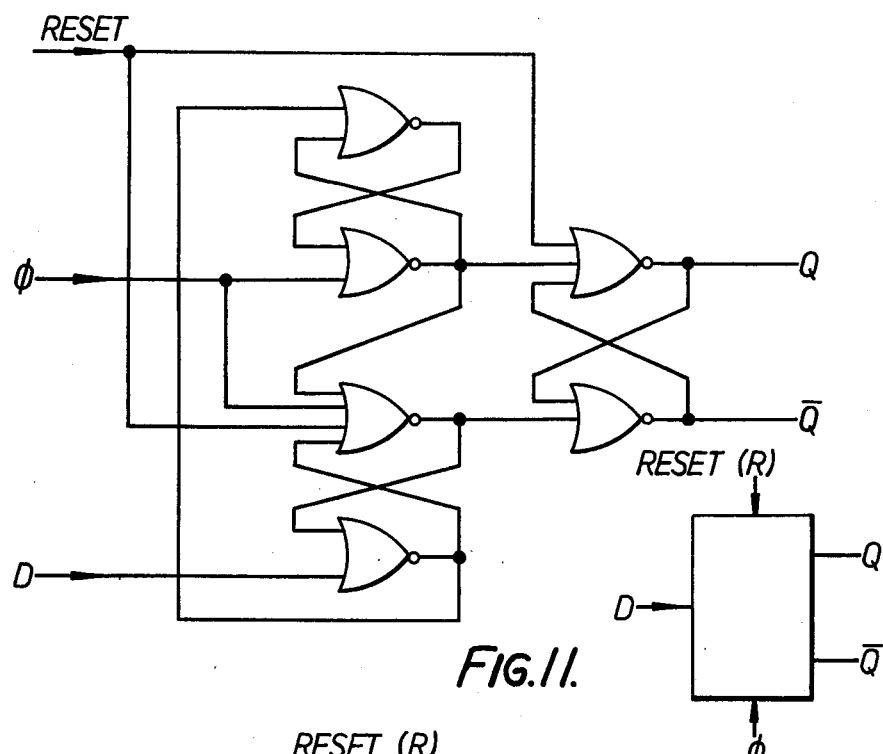
FIG. 11 is a circuit diagram of a bistable circuit of FIG. 10.
Figure 13:
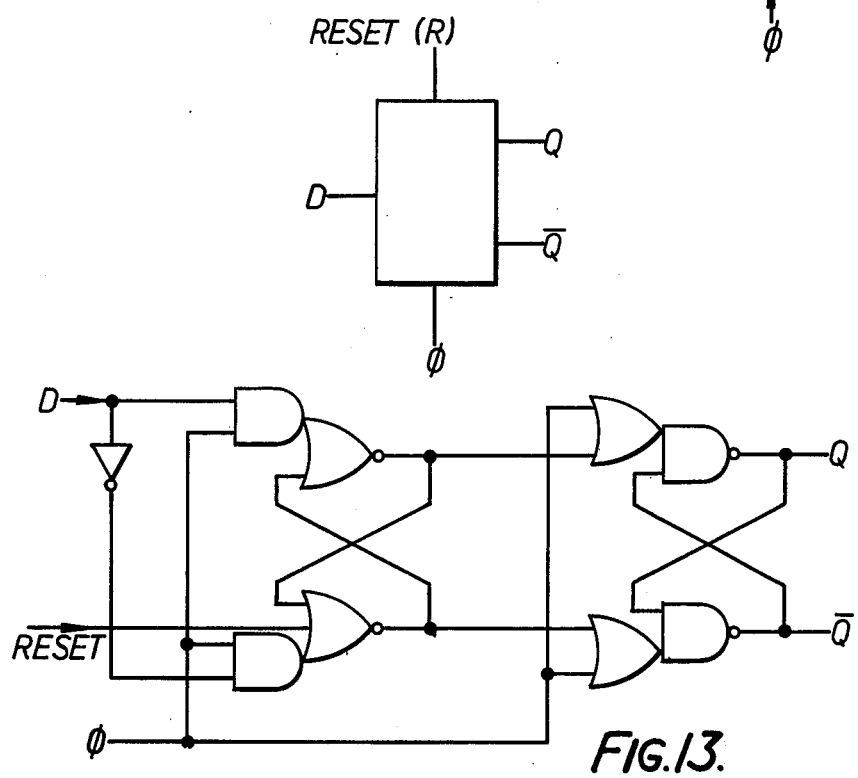
FIG. 13 is a circuit diagram of a bistable circuit of FIG. 12.
Figure 12:
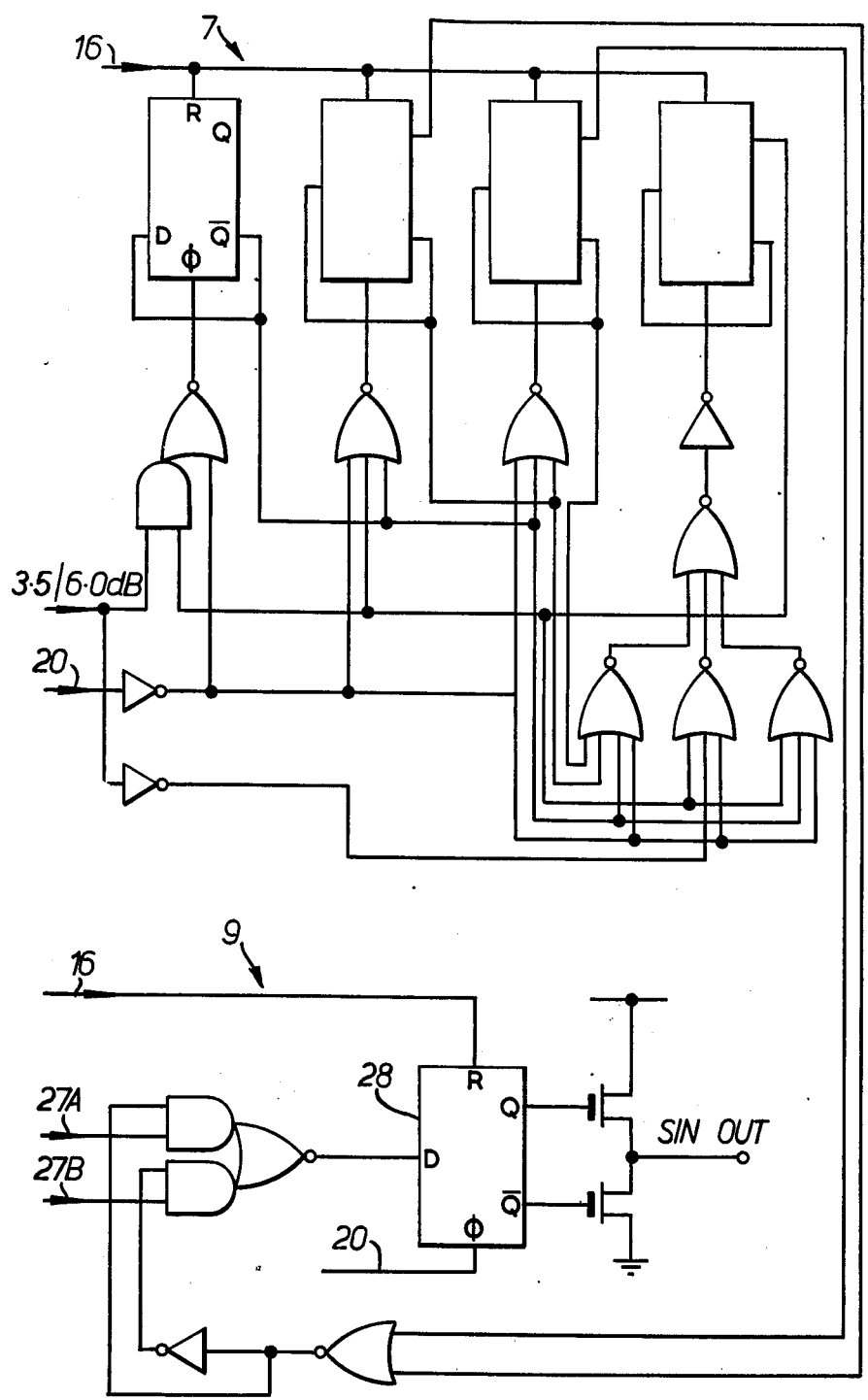
FIG. 12 is a detailed circuit diagram of blocks 7 and 9 of FIG. 1.

The output of the divider 3A is taken on line 21 to the value generating means 4A (FIG. 6) comprising five bistable circuits of the type shown in FIG. 7. Four of these bistable circuits (B8 to B11) are arranged to form a synchronous counter which is clocked by the divider output on line 21, the fifth bistable circuit operating to invert the output of the comparator 6A, and producing signals on lines 24a and b. This synchronous counter has a 3-bit output arranged to count in the sequence 6, 3, 1, 0, 1, 3, 6, etc. This sequence approximates to half a sine wave as is shown in FIG. 8. The three bit output is then taken on lines 22a to c to the comparator 6A (FIG. 9) where it is compared with the output of a pseudo-ramdom noise generator 8 received by comparator 6A or lines 23a to d. Both the comparator 6A and the noise generator 8 are clocked via the clock interface 5. The comparator operates to produce an output pulse, on being clocked, only if the output of the value generating means 4A is greater than that of the noise generator 8. The noise generator 8 (FIG. 10) comprises a counter comprising four bistable circuits of the type shown in FIG. 11. This counter will count continually in sequence from 0 to 15 but from which the inverted output will be taken thus producing the pseudo-random sequence: 15, 7, 11, 3, 13, 5, 9, 1, 14, 6, 10, 2, 12, 4, 8, 0, etc. (This inversion procedure will produce optimum regularity in the output from the comparator). Thus the following sequence, in numbers of pulses per cycle of the noise generator, will be produced during one cycle of the value generating means: 6, 3, 1, 0, 1, 3, 6, thus simulating half a sine wave. To generate the second half-wave, the fifth bistable (FIG. 6) of the value generating means 4A is arranged to invert the output of the comparator 6A (thus converting it to a "less than or equal to" circuit) on completion of one cycle of the value generating means 4A. This is achieved by gates AND1 and AND2 at the output of a bistable circuit 27 of the type shown in FIG. 7. The output of the comparator on line 27A in numbers of pulses for two complete cycles of the generating means 4A, is consequently proportional to the following: 6, 3, 1, 0, 1, 3, 6, 10, 13, 15, 16, 15, 13, 10. This output may then be integrated to produce the required analogue signal.

Branch B of the synthesiser will function in a similar manner.

Pulses from branches A and B are taken to output gating circuit 9 (FIG. 12) on lines 27A and 27B respectively. Circuit 9 is also connected to the output of a divide-by-ten counter 7 (FIG. 12), which is clocked by the clock signal on line 20. The counter 7 includes four bistable circuits of the kind shown in FIG. 11 and circuit 9 includes a bistable circuit 28 of the kind shown in FIG. 13. The counter 7 is operable to adjust the relative levels between the outputs from branch A and branch B to a ratio of −3.5dB or of −6dB in dependence uponn the state of the 3.5dB/6dB input. Thus, the ratio −3.5dB is achieved by allowing pulses from branch A to reach the output for 60% of an output time interval and allowing pulses from branch B for 40% of the same time interval. The output pulses are than integrated externally by means of a bipolar filter or leaky integrator 29, which is shown in FIG. 14, to produce an analogue voltage output. FIG. 14 also shows the integrated circuit of FIG. 1, being denoted 30, the ceramic crystal, denoted 31, and the keyboard, denoted 32.

It should be noted that, in FIG. 14, the ceramic crystal is assumed to be coupled to an on-chip oscillator which operates as the source of clock pulses. However, this oscillator is not shown in the preceding figures and may be of any suitable type readily catered for by one skilled in the art.

We claim:

1. A circuit suitable for use in an $m$ out of $n$ frequency-signalling system, the circuit comprising: first input means for receiving a clock signal; second input means for receiving data defining $m$ of said $n$ frequencies; $m$ channels coupled to the second input means for synthesizing respective ones of the $m$ frequencies out of $n$ possible frequencies, each channel comprising frequency division means coupled to the first input means for frequency division of the clock signal, the division ratio being selected in response to the said data received at the second input means; stochastic conversion means for converting the outputs of the frequency division means into pulse trains the repetition rates of which vary, respectively, at the $m$ frequencies; and means for mixing the pulse trains by interleaving the trains in time.

2. A circuit as claimed in claim 1, wherein the mixing means are adjustable to vary the proportions in which the pulse trains are interleaved.

3. A circuit as claimed in claim 2, wherein the stochastic conversion means comprises: pseudo-random noise generator means; $m$ value generating means in respective channels for generating signals representing a predetermined sequence of values at a rate determined by the output of the respective division means; and $m$ comparison means in respective channels for comparing the values produced by the respective value generating means with the values represented by the outputs of the noise generating means and producing a pulse whenever a predetermined relation exists between said values.

4. A circuit as claimed in claim 1, wherein the stochastic conversion means comprises: pseudo-random noise generator means; value generating means for generating signals representing a predetermined sequence of values at a rate determined by the output of the division means; and comparison means for comparing the values produced by the value generating means with the values respresented by the outputs of the noise generating means and producing a pulse whenever a predetermined relation exists between said values.

5. A circuit as claimed in claim 1, wherein the frequency division means includes means for non-integral division of the clock frequency.

6. A circuit as claimed in claim 3, wherein the frequency division means includes means for non-integral division of the clock frequency.

7. A circuit as claimed in claim 6, wherein the means for non-integral division comprises means for alternately dividing by two integral amounts, the mean of these amounts being non-integral.

8. A circuit as claimed in claim 7, wherein each frequency division means comprises: a resettable counter for counting clock pulses and having a clear input; and a count detector for detecting a predetermined count to produce a clear pulse for the clear input, and the means for non-integral division comprising means for changing by one the number of clock pulses supplied to the counter in alternate periods between clear pulses.

9. A circuit as claimed in claim 1, wherein each frequency division means comprises: a binary counter having a data input coupled to receive clock pulses from said first input means and also having a clear input; a plurality of means, including logic gates, for detecting respective counts of said counters; couplings from the second input means to said logic gates to enable one of said plurality of detecting means, in dependence upon the data at the second input means; and couplings from the detecting means to the clear input, whereby the counter is cleared on the detection of a count by an enabled one of said detecting means.

10. A circuit as claimed in claim 9, wherein each frequency division means comprises: means, having a trigger input, connected between the first input means and the count input to divide a received clock pulse into two pulses on the alternate receipt at its trigger input of a trigger pulse; and means coupling some of the detecting means to the trigger input.

11. A circuit as claimed in claim 10, wherein, in each channel, the value generating means comprises a binary counter connected to receive pulses from the associated detecting means and constructed to produce therefrom a series of binary coded values varying according to one half cycle of a sine wave.

12. A circuit as claimed in claim 11, wherein, in each channel, the comparison means comprises: an array of logic elements providing inputs for the values from the value generating means and inputs for the values from the noise generating means, the arrary being arranged to detect when the value from the value generating means is greater than the value from the noise generating means; and further logic elements for inverting the output of the array on receiving an inverting signal, the value generating means having a stage for producing said inverting signal at the end of each half cycle of the binary coded values from the value generating means.

* * * * *